United States Patent [19]
Miyoshi et al.

[11] Patent Number: 4,538,065
[45] Date of Patent: Aug. 27, 1985

[54] STROBOSCOPIC SCANNING ELECTRON MICROSCOPE

[75] Inventors: Motosuke Miyoshi, Fujisawa; Tetsuya Sano, Yokohama, both of Japan

[73] Assignee: Tokyo Shibaura Denki Kabushiki Kaisha, Kawasaki, Japan

[21] Appl. No.: 470,632

[22] Filed: Feb. 28, 1983

[30] Foreign Application Priority Data

Mar. 1, 1982 [JP] Japan .................................. 57-30593
Jun. 25, 1982 [JP] Japan ................................ 57-109525

[51] Int. Cl.³ ........................................... G01N 23/00
[52] U.S. Cl. ................................. 250/310; 324/158 D
[58] Field of Search ............... 250/306, 307, 310, 397; 329/158 D

[56] References Cited

U.S. PATENT DOCUMENTS

| 3,535,516 | 10/1970 | Munakata | 250/310 |
| 4,220,853 | 9/1980 | Feuerbaum et al. | 250/310 |
| 4,220,854 | 9/1980 | Feuerbaum | 250/310 |
| 4,223,220 | 9/1980 | Feuerbaum et al. | 250/310 |
| 4,413,181 | 11/1983 | Feuerbaum et al. | 250/310 |

Primary Examiner—Bruce C. Anderson

[57] ABSTRACT

A synchronizing signal from a tester which also supplies a test signal to an object to be measured is supplied to a programmable counter. An output from the programmable counter is supplied to a D/A converter which then produces an X-axis scanning control signal $S_X$. The output from the programmable counter is frequency-divided by a frequency divider. A frequency-divided signal is then supplied to a D/A converter which produces a Y-axis scanning control signal $S_Y$. An image memory is arranged to store data of the number of secondary electrons and to supply this data to a CRT display unit. A cursor is moved to specify a measuring position under the control of a controller.

6 Claims, 8 Drawing Figures

STROBOSCOPIC SCANNING ELECTRON MICROSCOPE

BACKGROUND OF THE INVENTION

The present invention relates to a stroboscopic scanning electron microscope.

In general, when electron beams are radiated onto an object to be examined, such as an LSI, secondary electrons are emitted. The number of secondary electrons varies with a surface potential of the LSI. This is called a voltage contrast phenomenon. When the number of secondary electrons generated at a surface portion of the LSI is measured based on the voltage contrast phenomenon, the potential of this surface portion can be measured. Thus, the stroboscopic scanning electron microscope utilizes a combination of the voltage contrast phenomenon and stroboscopic principles.

Figure 1:
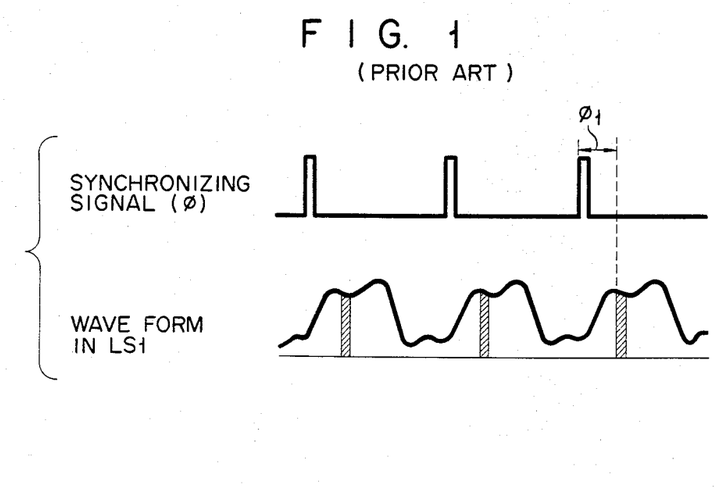
FIG. 1 is a timing chart for explaining the basic operation of a conventional stroboscopic scanning electron microscope.

In general, the internal circuits of the LSI are synchronously operated in accordance with a synchronizing signal $\phi$. As shown in FIG. 1, when the pulse electron beam radiates synchronously with the circuit operation at the phase $\phi_1$, a secondary electron signal indicates the surface potential at the phase $\phi_1$. When the surface of the LSI is two-dimensionally scanned to obtain the signal which indicates the number of secondary electrons, the potential distribution of the LSI at the phase $\phi_1$ can be displayed as an image.

Figure 2:
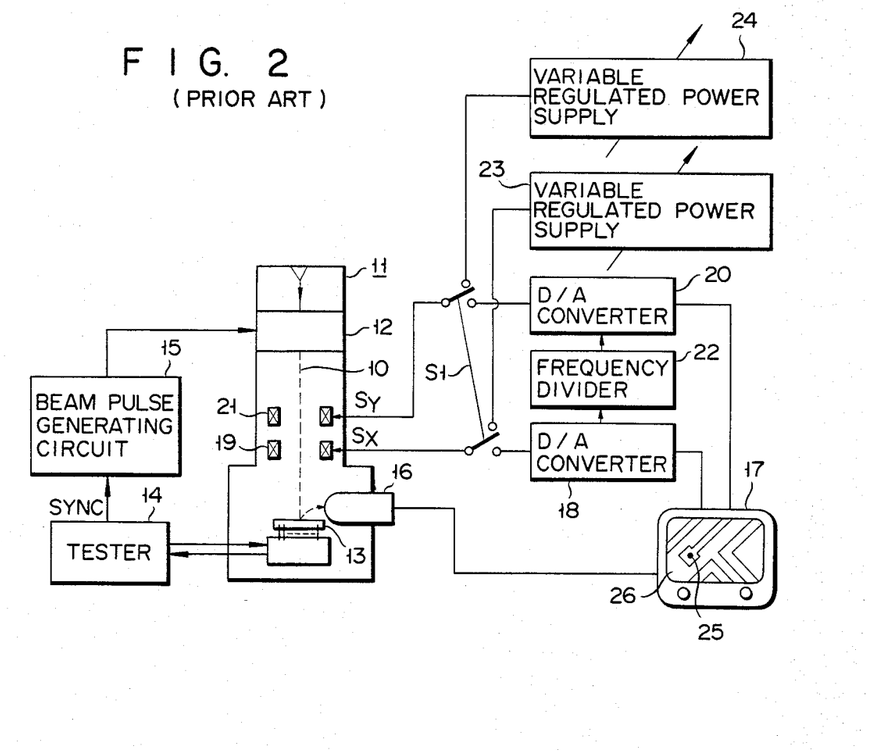
FIG. 2 is a block diagram showing the overall arrangement of the conventional stroboscopic scanning electron microscope.

FIG. 2 shows a conventional stroboscopic scanning electron microscope. Referring to FIG. 2, reference numeral 11 denotes a stroboscopic scanning electron microscope which has a beam pulse generator 12; 13, an LSI as the object to be measured; 14, a tester for supplying a test signal to the LSI 13; and 15, a beam pulse generating circuit for controlling the beam pulse generator 12. An electron beam 10 is generated by the beam pulse generating circuit 15 in synchronism with a synchronizing signal SYNC from the tester 14. Reference numeral 16 denotes a secondary electron detector which comprises, for example, a scintillator and a photo-multiplier; 17, a CRT display unit for displaying with an image contrast the number of secondary electrons detected by the secondary electron detector 16; 18, a D/A converter for supplying a scanning control signal $S_X$ to an X-axis scanning coil 19 through a changeover switch S1 to deflect the electron beam 10, thereby scanning the object with the electron beam 10 along the X-axis; 20, a D/A converter for supplying a scanning control signal $S_Y$ to a Y-axis scanning coil 21 through the changeover switch S1 to deflect the electron beam 10, thereby determining the position of the beam spot of the electron beam 10 along the Y-axis; 22, a frequency divider for frequency-dividing the clock signal from the D/A converter 18; and 23 and 24, variable constant-battery circuits, DC voltage signals which are respectively supplied to the X- and Y-axis scanning coils 19 and 21 through the changeover switch S1.

Figure 3:
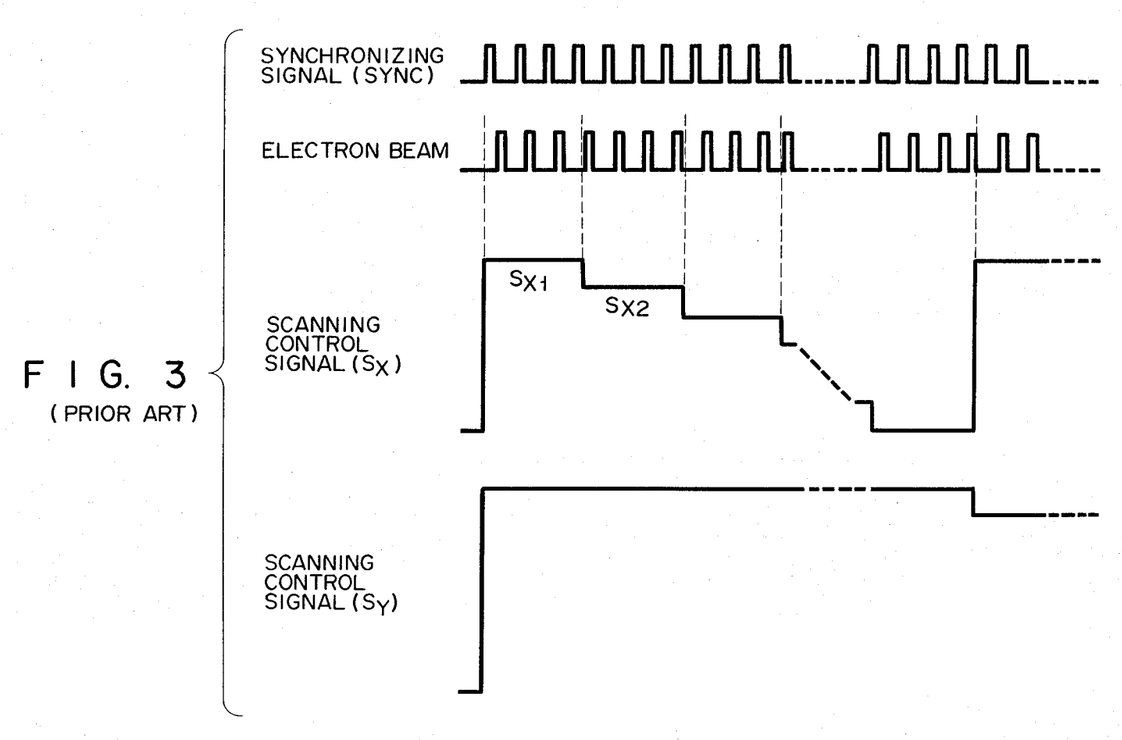
FIG. 3 is a timing chart for explaining the mode of operation of the conventional stroboscopic scanning electron microscope.

The mode of operation of the conventional stroboscopic scanning electron microscope shown in FIG. 2 will be described with reference to the timing chart in FIG. 3. A test signal is supplied from the tester 14 to the LSI 13 which is then operated. In this condition, a synchronizing signal SYNC corresponding to the test signal is supplied from the tester 14 to the LSI 13. The synchronizing signal SYNC is also supplied to the beam pulse generating circuit 15. The beam pulse generator 12 is also controlled by an output from the beam pulse generating circuit 15. As a result, an electron beam 10 which has a period corresponding to the period of the synchronizing signal SYNC is radiated from the beam pulse generator 12 onto the LSI 13. The position of the LSI 13 which corresponds to the beam spot of the electron beam 10 is determined by the X- and Y-axis scanning coils 19 and 21. The X-axis scanning coil 19 is controlled by the scanning control signal $S_X$ from the D/A converter 18. The output from the D/A converter 18 has a stepwise waveform one step of which corresponds to one pixel, as shown in FIG. 3. The Y-axis scanning coil 21 is controlled by the scanning control signal $S_Y$ from the D/A converter 20.

However, in the conventional stroboscopic scanning electron microscope shown in FIG. 2, the scanning control signals $S_X$ and $S_Y$ are not synchronized with the electron beams 10. As a result, the number of pulses of the electron beams 10 varies at different positions of the LSI 13 radiated therewith. For example, three electron beams are radiated onto the LSI 13 during the period of a scanning control signal $S_{X1}$, whereas four electron beams are radiated thereonto during the period of a scanning control signal $S_{X2}$. In this manner, when the number of beams radiated onto the LSI 13 differs, the corresponding numbers of secondary electrons for corresponding pixels differ. As a result, the measuring precision of the potential distribution on the LSI 13 is degraded.

Two observation modes are included in the observation of the LSI 13 to be described below. In the first observation mode, a pulsed electron beam is positioned on the desired node of the LSI 13, and a voltage waveform at the surface point of the LSI 13 is displayed by an oscilloscope. The first observation mode is called a waveform mode. In the second observation mode, an electron beam is scanned over the desired area of the LSI 13, and the number of secondary electrons from the LSI 13 is visually displayed on a CRT so as to show potential contrast images of the LSI obtained at a desired phase. The second observation mode is called an image mode using an SEM (scanning electron microscope). In the conventional stroboscopic scanning electron microscope shown in FIG. 2, the secondary electron signal from the LSI 13 is detected by the secondary electron detector 16. An output from the secondary electron detector 16 is then supplied as an analog signal to the CRT display unit 17. In the CRT display unit 17, the numbers of secondary electrons are displayed corresponding to the phases of voltage signal from the LSI, thereby obtaining potential contrast images.

On the other hand, when the electron beam 10 is radiated onto a given position of the surface of the LSI 13, the changeover switch S1 is operated to apply voltages preset by the variable regulated power supplies 23 and 24 to the X- and Y-axis scanning coils 19 and 21, respectively. The position onto which the electron beam 10 is radiated is determined by the voltages preset by the variable regulated power supplies 23 and 24. When the beam spot of the electron beam 10 is moved on the LSI 13 by operating the variable regulated power supplies 23 and 24, a spot 25 on the CRT display unit 17 is also moved. Therefore, in order to obtain a voltage waveform at the given point of the surface of the LSI 13 by the conventional electron microscope, the surface of the LSI 13 is scanned with the electron beam 10 to display the secondary electron image on the CRT display unit 17. Thereafter, the changeover switch S1 is switched to set the waveform mode. When the preset voltages of the variable regulated power supplies 23 and 24 are changed, the spot 25 on the CRT display unit 17 is moved to detect a desired observation point. It should be noted that an image 26 remains as an afterimage even if the image display state is changed to spot radiation since the CRT display unit 17 has an afterimage effect. For this reason, the spot 25 is moved while the observer is observing the image 26, so that the electron beam 10 can be radiated onto the desired position of the surface of the LSI 13.

However, in the conventional electron microscope, positioning must be performed for each of a plurality of observation points which are present on the LSI 13, resulting in cumbersome measurement. Furthermore, positioning for the observation points is performed using the afterimage obtained when the spot of the electron beam 10 is moved, thereby degrading the positioning precision. In addition to these drawbacks, the number of injected electrons per unit area on the LSI 13 increases when the CRT display unit 17 is set in a high magnification display mode. As a result, the operation of the LSI 13 is adversely affected. Furthermore, since the electron beam 10 is continuously radiated onto the LSI 13 while positioning for each observation point is being performed, the LSI 13 is greatly affected.

SUMMARY OF THE INVENTION

It is an object of the present invention to provide a stroboscopic scanning electron microscope wherein the number of pulses of an electron beam radiated onto each pixel is kept constant to perform a highly precise measurement.

It is another object of the present invention to provide a stroboscopic scanning electron microscope wherein an electron beam may be accurately positioned on an observation point.

It is still another object of the present invention to provide a stroboscopic scanning electron microscope wherein the electron beam is not radiated onto an object to be measured while the observation point is being positioned, thereby decreasing the effect of the electron beam on the object.

It is still another object of the present invention to provide a stroboscopic scanning electron microscope wherein a plurality of observation points may be simultaneously selected, thereby shortening the measuring time.

The above objects may be achieved by a stroboscopic scanning electron microscope which comprises: a scanning electron microscope having a beam pulse generator for emitting a pulsed electron beam onto an object to be measured; test signal supplying means for supplying a test signal to the object; beam pulse generating means for controlling said beam pulse generator in response to a synchronous signal from said test signal supplying means; scanning controlling means for controlling scanning by the electron beam from said beam pulse generator; detecting means for detecting the number of secondary electrons generated from the object upon focusing of the electron beam thereon; memory means for storing data of the number of secondary electrons detected by the detecting means for use in developing potential contrast images; displaying means for displaying the potential contrast images from said data stored in the memory means; display controlling means for controlling said display means and address generating means for reading a desired address of the memory means which is accessed by the displaying means and for generating an address signal to the memory means.

According to the present invention, the electron beam can be positioned on the observation point with high precision. Furthermore, the electron beam is not radiated onto the object while the observation point is being selected, thereby decreasing the influence of the electron beam on the object. In addition to the advantages described above, a plurality of observation points can be simultaneously selected, thus shortening the measuring time.

DETAILED DESCRIPTION OF THE PREFERRED EMBODIMENT

Figure 4A:
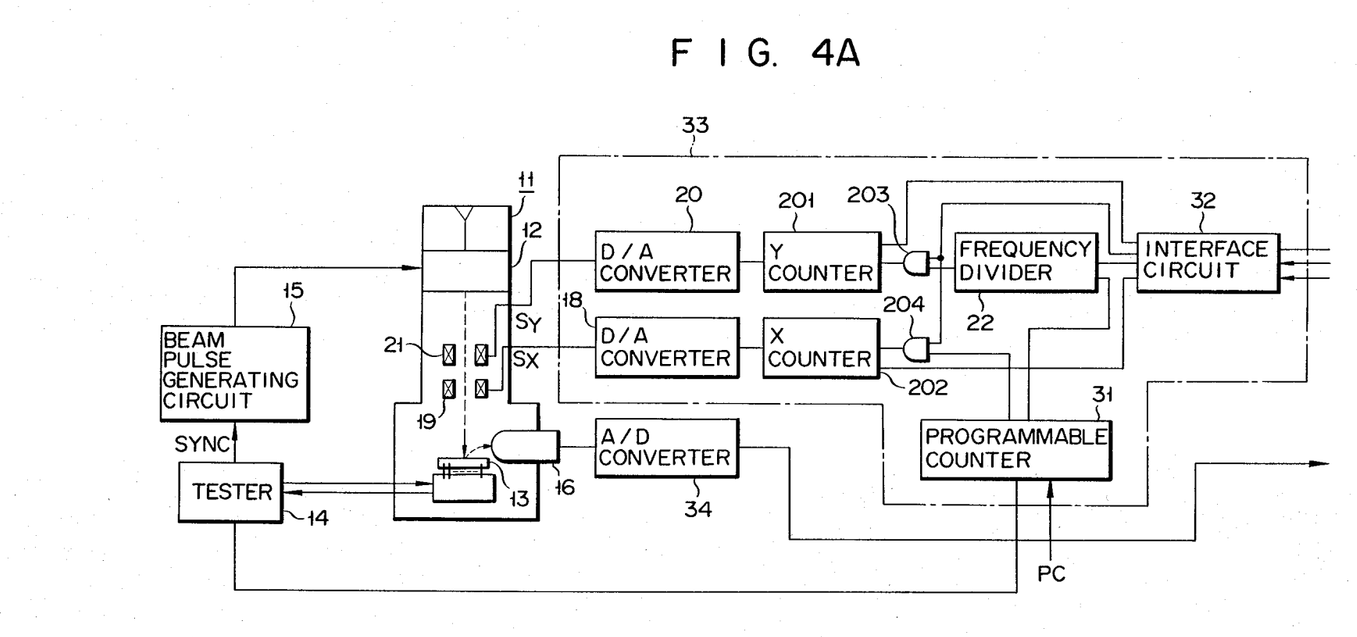
FIGS. 4A and 4B are block diagrams of a stroboscopic scanning electron microscope according to an embodiment of the present invention.
Figure 4B:
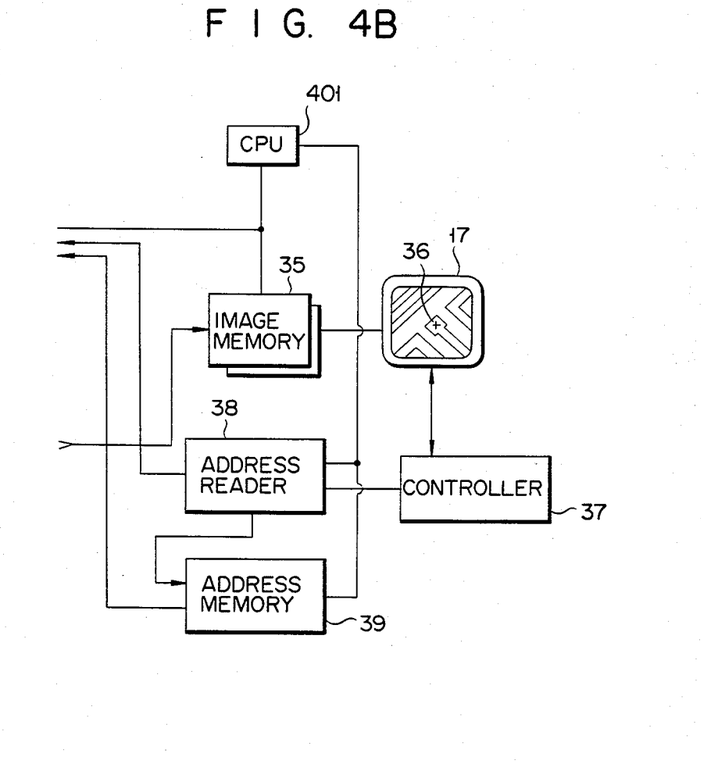

FIGS. 4A and 4B show a stroboscopic scanning electron microscope according to an embodiment of the present invention. Referring to FIGS. 4A and 4B, a synchronizing signal SYNC from a tester 14 is counted down by a programmable counter 31. An output from the programmable counter 31 is supplied to a D/A converter 18 through an AND circuit 204 and an X counter 202. An output from the programmable counter 31 is also supplied to a frequency divider 22. A scanning control section 33 comprises D/A converters 18 and 20, a Y counter 201, the X counter 202, AND gates 203 and 204, the frequency divider 22, the programmable counter 31 and an interface circuit 32. An output (FIG. 5) from the D/A converter 18 corresponds to a signal obtained by counting down the synchronizing signal SYNC from the tester 14 by means of the programmagle counter 31. Therefore, a scanning control signal $S_X$ can be synchronized with the synchronizing signal SYNC. For example, when the count of the programmable counter 31 is preset to be "4", the synchronizing signal SYNC is frequency-divided by $\frac{1}{4}$. A beam pulse generator 12 then produces four pulses of electron beam 10 for every scanning control signal $S_X$. The number of pulses of the electron beam 10 is determined by the preset count of the programmable counter 31 which is preset by a pulse number setting signal PC. As a result, the number of pulses of the electron beam 10 emitted from the beam pulse generator 12 for every step of the scanning control signal $S_X$ can be kept constant by the programmable counter 31. As a result, the number of pulses of the electron beam 10 emitted from one pixel can be preset to be constant, thus improving the measurement precision.

Figure 5:
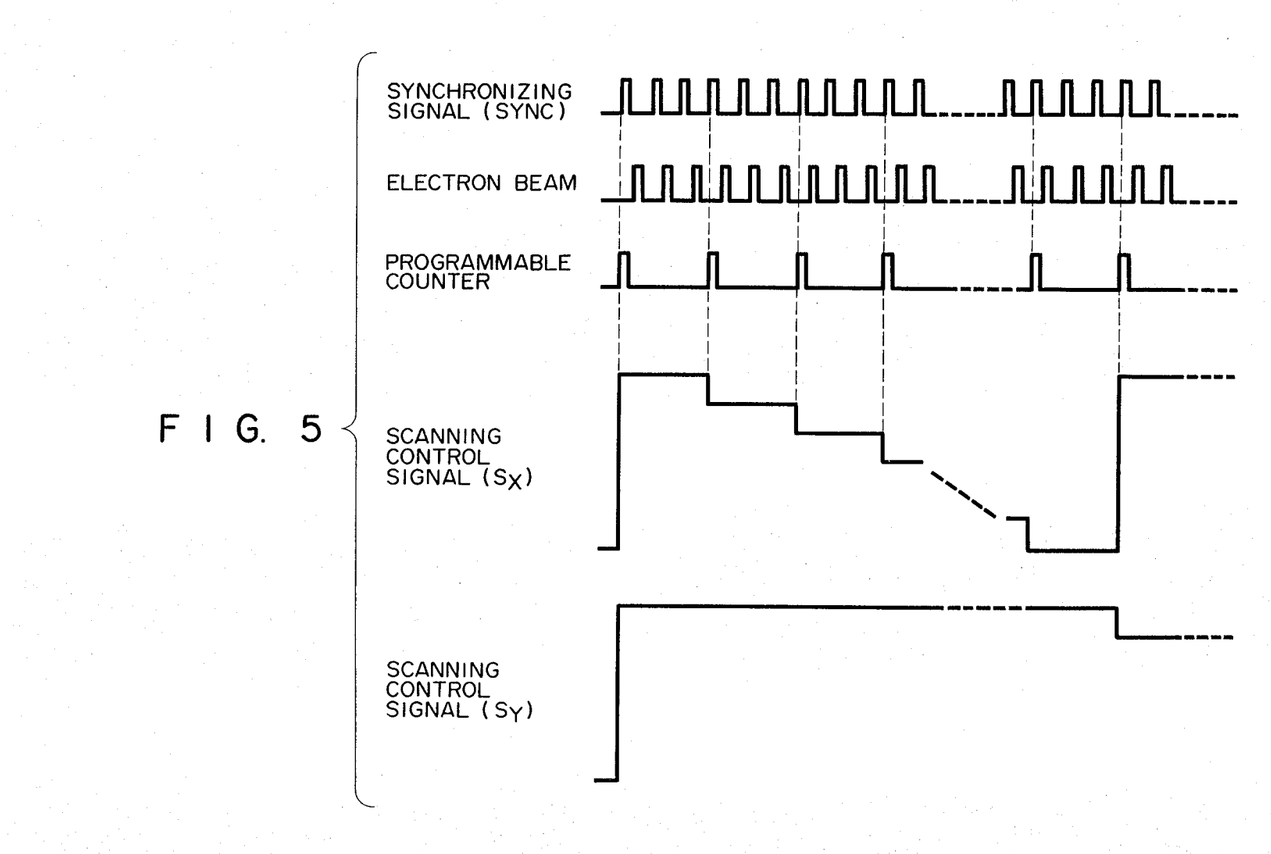
FIG. 5 is a timing chart for explaining the mode of operation of the stroboscopic scanning electron microscope according to the embodiment of the present invention.

When the scanning control signal $S_X$ and a scanning control signal $S_Y$ shown in FIG. 5 are applied across an X-axis scanning coil 19 and a Y-axis scanning coil 21, respectively, an LSI 13 is two-dimensionally scanned with the electron beams 10. The number of secondary electrons from the LSI 13 is detected by a secondary electron detector 16. A secondary electron signal from the secondary electron detector 16 is supplied to an A/D converter 34 to be converted by the A/D converter 34 to a digital signal. The secondary electron signal in the digital form from the A/D converter 34 is stored in an image memory 35. The secondary electron signal is read out from the image memory 35 as needed and is displayed at a CRT display unit 17. The number of pixels in the image memory 35 corresponds to that of scanning lines of the CRT display unit 17, and also to the number of steps of the scanning control signal having a stepwise waveform. Furthermore, the steps of the scanning control signal respectively correspond to the pixels of the image memory 35 in one-to-one correspondence. A cross-shaped cursor 36 and an image 26 are displayed on the screen at the CRT display unit 17. The position of the cursor 36 is changed by a controller 37.

A case for observing a voltage waveform at a given position which is included in the surface of the LSI 13 and which is displayed at the CRT display unit 17 will be described. Under the control of the controller 37, the observer moves the cursor 36 to a position of the screen at the CRT display unit 17 so as to observe a voltage waveform at this position. An address of the image memory 35 which corresponds to a pixel at which the cursor 36 is positioned is read by an address reader 38. The address of the image memory 35 which corresponds to this pixel is stored in an address memory 39. The address memory 39 stores a plurality of addresses of the image memory 35. It should be noted that the addresses of the image memory 35 respectively correspond to the pixels on the screen in one-to-one correspondence. The address data stored in the address memory 39 is supplied to the scanning control section 33. The D/A converter 18 supplies the scanning control signal $S_X$ to the X-axis scanning coil 19. The D/A converter 20 supplies the scanning control signal $S_Y$ to the Y-axis scanning coil 21. The electron beam 10 is then directed to a position of the surface of the LSI 13 which is specified by the cursor 36 at the CRT display unit 17. The interface circuit 32, the address reader 38 and the address memory 39 are controlled by a CPU (central processing unit) 401.

Figure 6:
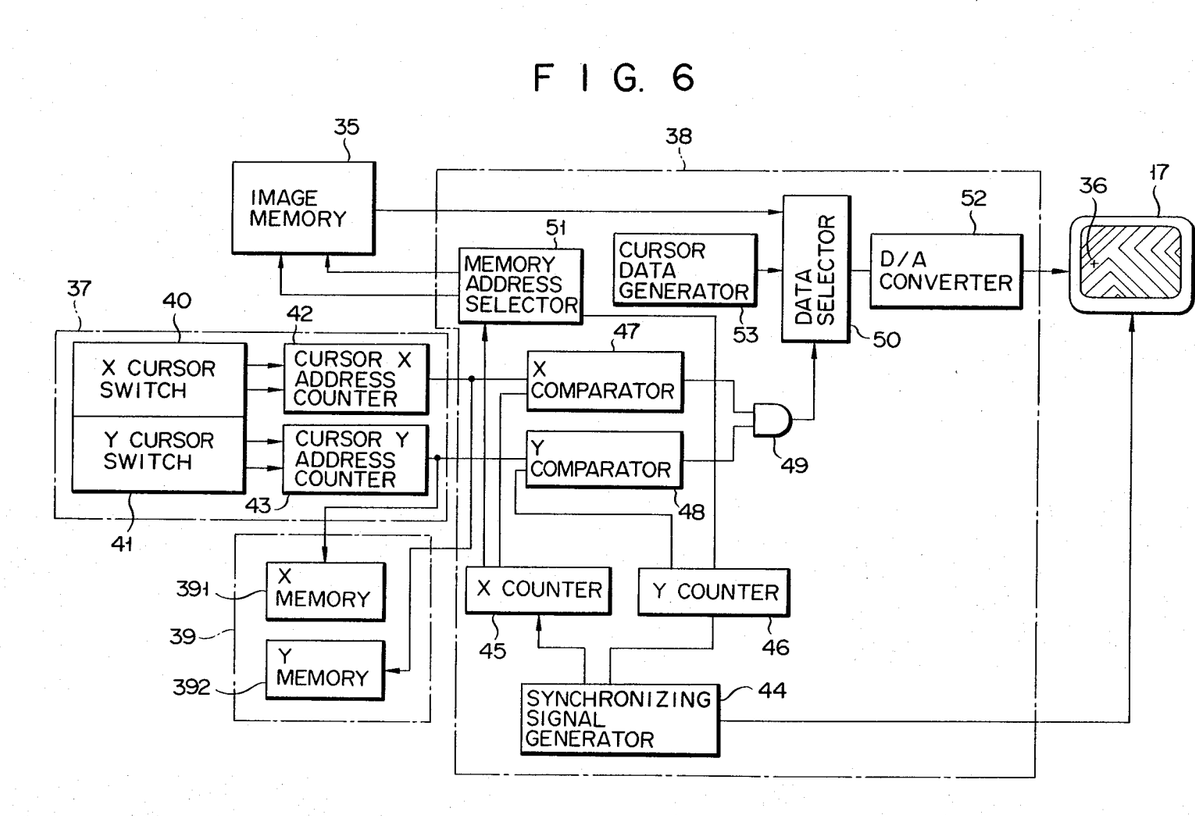
FIG. 6 is a circuit diagram showing the main part of the stroboscopic scanning electron microscope according to the embodiment of the present invention.
Figure 7:
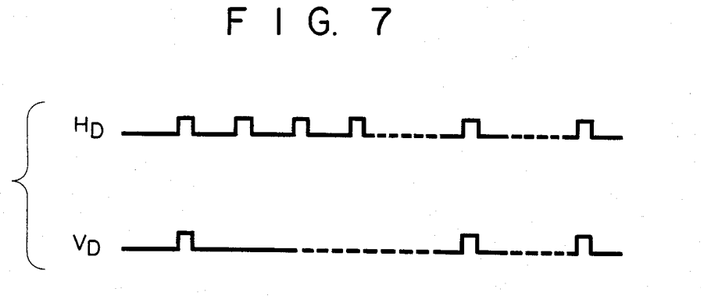
FIG. 7 shows the horizontal and vertical synchronizing signals.

The main part of the stroboscopic scanning electron microscope according to the embodiment of the present invention will be described with reference to FIGS. 6 and 7. FIG. 6 is a detailed block diagram showing the CRT display unit 17, the image memory 35, the controller 37, the address reader 38, and the address memory 39. Referring to FIG. 6, reference numeral 40 denotes an X-axis cursor switch; 41, a Y-axis cursor switch. The X- and Y-axis cursor switches 40 and 41 are operated to move the cursor 36 displayed at the CRT display unit 17 along the X- and Y-axis, respectively. Amounts of displacement of the cursor 36 along the X- and Y-axis are counted by cursor X and Y address counters 42 and 43, respectively. When the operator operates the X-axis cursor switch 40 or the Y-axis cursor switch 41 once, the cursor 36 is moved by a distance corresponding to one pixel in the X- or Y-axis. Reference numeral 44 denotes a synchronizing signal generator for generating horizontal and vertical synchronizing signals $H_D$ and $V_D$ for image display. The horizontal and vertical synchronizing signals $H_D$ and $V_D$ are supplied to X and Y counters 45 and 46, respectively. As shown in FIG. 7, a vertical synchronizing signal $V_D$ is generated every time 512 horizontal synchronizing signals $H_D$ are generated, as shown in FIG. 7. In this manner, the screen of the CRT display unit 17 is scanned. Outputs from the cursor X address counter 42 and the X counter 45 are supplied to and are compared by an X comparator 47. Similarly, outputs from the cursor Y address counter 43 and the Y counter 46 are supplied to and are compared by a Y comparator 48. Outputs from the X and Y comparators 47 and 48 are supplied to a data selector 50 through an AND gate 49.

The outputs from the X and Y counters 45 and 46 are also supplied to a memory address selector 51. As a result, the memory address selector 51 sequentially produces a scanning signal to access the image memory 35. In response to the scanning signal, the secondary electron signal is read out from the image memory 35. The read-out signal is supplied to the CRT display unit 17 through the data selector 50 and a D/A converter 52 and is displayed at the CRT display unit 17. When coincidence signals are produced by the X and Y comparators 47 and 48, respectively, the AND gate 49 produces a signal of logic level "1". As a result, cursor display data (e.g., white cross-shaped cursor data) stored in a cursor data generator 53 is supplied to the CRT display unit 17 through the data selector 50 and the D/A converter 52 and is then displayed at the CRT display unit 17. The cursor 36 is displayed at a position corresponding to the X and Y addresses respectively accessed by the X- and Y-axis cursor switches 40 and 41.

The address data which indicates the measuring position specified by the cursor 36 are stored in the address memory 39. More particularly, the count of the cursor X address counter 42 is stored in an X memory 391, and the count of the cursor Y address counter 43 is stored in a Y memory 392.

A case will now be described in which the electron beam 10 emitted from the beam pulse generator 12 is positioned on one point of the surface of the LSI 13, using the address data indicating a measuring position stored in the address memory 39. A signal of logic level "0" is supplied from the CPU 401 to the AND gates 203 and 204 through the interface circuit 32. As a result, the AND gates 203 and 204 are disabled. The signals from the programmable counter 31 and the frequency divider 22 may not be entered in the X and Y counters 202 and 201, respectively. For this reason, the data stored in the address memory 39 is set in the X and Y counters 202 and 201. The data stored in the X memory 391 is set in the X counter 202, and the data stored in the Y memory 392 is set in the Y counter 201. The D/A converter 18 then supplies the scanning control signal $S_X$ to the X-axis scanning coil 19, and the D/A converter 20 supplies the scanning control signal $S_Y$ to the Y-axis scanning coil 21. As a result, the electron beam 10 emitted from the beam pulse generator 12 is positioned on the measuring position specified by the cursor 36.

What we claim is:

1. A stroboscopic scanning electron microscope which comprises:

a scanning electron microscope having a beam pulse generator for emitting a pulsed electron beam onto an object to be measured;

test signal supplying means for supplying a test signal to the object;

beam pulse generating means for controlling said beam pulse generator in response to a synchronizing signal from said test signal supplying means;

scanning controlling means for controlling scanning by the electron beam from said beam pulse generator;

detecting means for detecting the number of secondary electrons generated from the object upon focusing of the electron beam thereon;

memory means for storing data of the number of secondary electrons detected by said detecting means for use in developing potential contrast images;

displaying means for displaying said potential contrast images from said data stored in said memory means;

display controlling means for controlling said display means; and address generating means for reading a desired address of said memory means which is accessed by said displaying means and for generating an address signal to said memory means.

2. A microscope according to claim 1, wherein said scanning controlling means comprises:

X-axis scanning means for scanning the object with the pulsed electron beam along an X-axis;

Y-axis scanning means for scanning the object with the pulsed electron beam along a Y-axis;

first digital-to-analog converting means for supplying the first scanning control signal to said X-axis scanning means;

second digital-to-analog converting means for supplying the second scanning control signal to said Y-axis scanning means;

counting means for counting the synchronizing signal from said test signal supplying means to supply a count signal to said first digital-to-analog converting means; and frequency dividing means for frequency-dividing the count signal from said counting means to supply a frequency-divided signal to said second digital-to-analog converting means.

3. A microscope according to claim 2, wherein said counting means comprises a programmable counter.

4. A microscope according to claim 1, wherein said display controlling means comprises:

X- and Y-axis cursor switches;

first counting means for counting the number of times of operations of said X-axis cursor switch;

second counting means for counting the number of times of operations of said Y-axis cursor switch;

an X-axis counter for counting a horizontal synchronizing signal supplied to said displaying means;

a Y-axis counter for counting a vertical synchronizing signal supplied to said displaying means;

a first comparator for comparing a count of said first counting means and a count of said X-axis counter;

a second comparator for comparing a count of said second counting means and a count of said Y-axis counter;

address memory means for storing the counts of said first counting means and said second counting means; and means for allowing the counts of said first counting means and said second counting means to be stored in said address memory means when coincidence signals are produced from said first comparator and said second comparator, respectively, and for displaying a cursor at a predetermined position on said display means, said predetermined position being specified by said first counting means and said second counting means.

5. A microscope according to claim 4, wherein said address memory means stores a plurality of addresses.

6. A microscope according to claim 1, wherein said scanning controlling means comprises:

X-axis scanning means for scanning the object with the pulsed electron beam along an X-axis;

Y-axis scanning means for scanning the object with the pulsed electron beam along a Y-axis;

first digital-to-analog converting means for supplying the first scanning control signal to said X-axis scanning means;

second digital-to-analog converting means for supplying the second scanning control signal to said Y-axis scanning means;

counting means for counting the synchronizing signal from said test signal supplying means to supply a count signal to said first digital-to-analog converting means;

frequency dividing means for frequency-dividing the count signal from said counting means to supply a frequency-divided signal to said second digital-to-analog converting means;

X-axis counting means for supplying a count thereof to said first digital-to-analog converting means;

Y-axis counting means for supplying a count thereof to said second digital-to-analog converting means;

means for setting address data stored in said address memory means in said X-axis counting means and said Y-axis counting means; and means for prohibiting supply of the signals from said counting means and said frequency dividing means to said X-axis counting means and said Y-axis counting means.

* * * * *